United States Patent
Ueno

(10) Patent No.: US 6,482,741 B1
(45) Date of Patent: Nov. 19, 2002

(54) COPPER WIRING STRUCTURE COMPRISING A COPPER MATERIAL BURIED IN A HOLLOW OF AN INSULATING FILM AND A CARBON LAYER BETWEEN THE HOLLOW AND THE COPPER MATERIAL IN SEMICONDUCTOR DEVICE AND METHOD FABRICATING THE SAME

(75) Inventor: Kazuyoshi Ueno, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/377,717

(22) Filed: Aug. 20, 1999

Related U.S. Application Data

(62) Division of application No. 09/104,044, filed on Jun. 25, 1998.

(30) Foreign Application Priority Data

Jun. 25, 1997 (JP) .............................................. 9-168813

(51) Int. Cl.$^7$ ................................................. H01L 2/44
(52) U.S. Cl. ...................... 438/687; 438/677; 438/781
(58) Field of Search ................................. 438/687, 674, 438/675, 677, 676, 780, 781

(56) References Cited

U.S. PATENT DOCUMENTS

| | | | |
|---|---|---|---|
| 5,409,862 A | | 4/1995 | Wada et al. |
| 5,559,367 A | * | 9/1996 | Cohen et al. |
| 5,661,345 A | | 8/1997 | Wada et al. |
| 5,674,355 A | * | 10/1997 | Cohen et al. |
| 5,679,269 A | * | 10/1997 | Cohen et al. |
| 5,698,901 A | | 12/1997 | Endo |
| 5,942,048 A | * | 8/1999 | Fujisaki et al. ............... 438/98 |
| 6,051,778 A | * | 4/2000 | Ichinose et al. ............ 438/119 |
| 6,143,658 A | * | 11/2000 | Donnelly et al. ........... 438/652 |

FOREIGN PATENT DOCUMENTS

| | | | |
|---|---|---|---|
| EP | 244535 | | 6/1990 |
| EP | 0 751 567 A2 | | 2/1997 |
| JP | H2-114639 | * | 4/1990 |
| JP | 4-350937 | | 12/1992 |
| JP | 6-140393 | | 5/1994 |
| JP | 6-140401 | | 5/1994 |
| JP | 7-297186 | | 11/1995 |
| JP | H8-64591 | * | 3/1996 |
| JP | 8-83842 | | 3/1996 |
| JP | H8-102463 | * | 4/1996 |
| JP | 9-20942 | | 1/1997 |
| JP | 9-45771 | | 2/1997 |
| JP | 10-214832 | | 8/1998 |

OTHER PUBLICATIONS

Hayashi et al., "A New Two–step metal–CMP Technique for a High Performance Multilevel Interconnects Featured by Al–and "Cu in LowE, Organic Film"—Metalizations"; IEEE Symposium on VLSI Technology Digest of Technical Papers; (1996) ; pp. 88–89.

(List continued on next page.)

*Primary Examiner*—Kevin M. Picardat
(74) *Attorney, Agent, or Firm*—Foley & Lardner

(57) ABSTRACT

The object of the present invention is to provide a copper wiring structure in which finely processed copper wiring in a wiring structure in grooves is steadily formed with a high reliability and a method for fabricating the same, wherein an electroconductive carbon layer is formed between the copper material—a copper wiring of a wiring structure in grooves in which the copper material is buried into a wiring groove or holes formed in the organic interlayer film mainly composed of carbon—and the organic interlayer film. This electroconductive carbon layer is formed, after forming wiring grooves or holes in the desired region of the organic interlayer film, by a modification of the inner wall of wiring grooves or holes by plasma irradiation. The copper wiring of the wiring structure in grooves as described above is formed by depositing copper on the electroconductive carbon layer.

8 Claims, 7 Drawing Sheets

OTHER PUBLICATIONS

M. Eizenberg et al., *Chemical vapor deposited TiCN: A new barrier metallization for submicron via and contact applications*, J. Vac. Sci. Technol. A 13 (3), May/Jun. 1995, pp. 590–595.*

M. Eizenberg et al., "TiCN: *A new chemical vapor deposited contact barrier metallization for submicron devices*", Appl. Phys. Lett. 65 (19), Nov. 7, 1994, pp. 2416–2418.*

A. Sekiguchi et al.,*Low Temperature and Low Pressurre Process Metal Organic Chemical Vapor Deposition (MOCVD) of Superior Barrier Layers in Advanced ULSI Devices*, Conference Proceedings ULSI XI 1996 Materials Research Society, pp. 355–361.*

B. Luther et al., *Planar Copper–Polyimide Back End of The Line Interconnections for ULSI Devices*, Jun. 8–9, 1993 VMIC Conference 1993 ISMIC–102/93/0015, pp. 15–21.*

* cited by examiner

COPPER WIRING STRUCTURE COMPRISING A COPPER MATERIAL BURIED IN A HOLLOW OF AN INSULATING FILM AND A CARBON LAYER BETWEEN THE HOLLOW AND THE COPPER MATERIAL IN SEMICONDUCTOR DEVICE AND METHOD FABRICATING THE SAME

This application is a divisional of application Ser. No. 09/104,044, filed Jun. 25, 1998.

BACKGROUND OF THE INVENTION

1. Field of the Invention

The present invention relates to a copper wiring structure for use in a semiconductor device and a method of fabricating the same.

2. Description of the Related Art

The art for fabricating fine and highly integrated semiconductor devices has been industriously developed in recent years. Semiconductor devices currently used are fabricated in a dimensional order of about 0.13 μm. Semiconductor devices, for example a memory device, such as 4 gigabit DRAM or a logic device, use design standards based on this size and are under research and development.

Three dimensional stacks of highly integrated semiconductor elements are being investigated along with fabricating a highly integrated two dimensional device with a fine construction. For this purpose, a multilayer interconnection technology with a fine construction has became most important. In the multilayer interconnection technology, a crucial problem is to select conductive materials used for wiring and insulation materials for use as interlayer insulation films between the wiring layers.

A wiring with aluminum (Al) alloys is mainly used as wiring layers in the currently available semiconductor devices. However, copper wiring is being investigated and developed as a candidate for the fine wiring layer to be used in the future since it has a lower electric resistance than the aluminum (Al) wiring. As for a copper wiring structure, investigation has been mainly directed toward a wiring structure in grooves in which a copper material is buried into a wiring groove, which is disclosed, for example, in Japanese Unexamined Patent Publication No. 7-297186. This is because a fine processing of copper by a reactive ion etching (RIE) is difficult.

A silicon oxide film is used for the insulating material to be processed into an interlayer insulation film on which wiring grooves are formed in the conventional art described above. However, investigation has been recently carried out about the use of an organic insulating material, such as benzocyclobutene (BCB: Digest of Technological Papers, p88–89, Symposium on VLSI Technology, 1996).

In such a manner, investigation is carried out about the use of the organic insulation materials as interlayer insulation materials because they have a smaller relative dielectric constant of 2 to 3 as compared with the relative dielectric constant of about 4 in the silicon oxide film. In the relative dielectric constant, reduction allows the induced capacity between wiring layers to decrease so as to make it possible to largely improve electric transfer speed among the wiring layers in cooperation with the low resistivity of the copper wiring.

It becomes difficult, however, to form seed layers on the entire inner wall face of the wiring grooves in the conventional art as hitherto described when the wiring grooves have a fine width and large depth. This is because, since metal films such as a TiN film or tantalum film (Ta film) used for seed layers are deposited by a sputtering method, step coverage of the film becomes poor thereby being difficult to completely bury copper into the wiring grooves.

When seed layers are formed on the entire inner wall face of the wiring grooves, on the other hand, the film thickness of the seed layer at the opening of the wiring groove is so thickened that wiring resistance is increased even after burying copper into the wiring grooves because the electric resistance of the seed layer is larger than that of copper.

As hitherto described, it becomes difficult to fabricate wiring in grooves having a large ratio between the wiring height and width, or having a high aspect ratio.

SUMMARY OF THE INVENTION

Accordingly, it is an object of the present invention to provide a copper wiring structure of the semiconductor device as a finely fabricated wiring in grooves.

It is another object of the present invention to provide a semiconductor device provided with a copper wiring structure as described above.

It is still another object of the present invention to provide a method for fabricating the copper wiring structure of the foregoing semiconductor device.

In accordance with one aspect of the present invention, there is provided a semiconductor device provided with a copper wiring structure formed on a semiconductor substrate via an underlying insulation layer. In the semiconductor device of the present invention, the copper wiring structure is provided with a film for fabricating wiring provided with concave portions and formed on the underlying insulation film, a copper material buried into the concave portions and an electroconductive carbon layer lying between the copper material and the material for fabricating wiring.

In accordance with another aspect of the present invention, there is provided a copper wiring structure of a semiconductor device provided with a film for fabricating wiring provided with concave portions and formed on the underlying insulation film, a copper material buried into the concave portions and an electroconductive carbon layer lying between the copper material and a material for fabricating wiring.

It is preferable in the present invention that the copper material is provided with a multilayer structure, or that the film for fabricating wiring is provided with an organic interlayer film containing carbon as a main component.

It is more preferable in the present invention that the film for fabricating wiring is further provided with a protective insulation film formed on the organic interlayer film, or that the organic interlayer film is composed of an amorphous carbon layer supplemented with fluorine, or that the organic interlayer film is composed of a material having relative dielectric constant of 3 or less.

In accordance with a still another aspect of the present invention, there is provided a method for fabricating a copper wiring structure of the semiconductor device comprising a first step of forming a film for fabricating wiring including an organic interlayer film containing carbon as a main component on the semiconductor substrate, a second step of forming concave portions in the top face side of the film for fabricating wiring, a third step of forming an electroconductive carbon layer by a modification of the surface including the inner side of the concave portions of the organic interlayer film, and a fourth step of selectively depositing copper on the electroconductive carbon.

In the method of fabricating the copper wiring structure of a semiconductor device according to the present invention, it is more preferable that the organic interlayer film is an amorphous carbon film supplemented with fluorine deposited by a plasma CVD method using a reaction gas composed of tetrafluorocarbon and methane. In the method, the first step includes a sub-step of forming an inorganic insulation film on the organic interlayer film after forming the organic interlayer film or the third step includes a step for forming the electroconductive carbon layer by a modification of the exposed organic interlayer film using a plasma irradiation.

Modification as described above is applicable to wiring grooves or holes even when their dimensions are fine, since the layer is uniformly formed by controlling the thickness with a high precision. The electroconductive carbon layer thus formed can also serve as a growth seed layer.

It is more preferable in the method for fabricating the copper wiring structure of the semiconductor device according to the present invention that the inorganic insulation film comprises a silicon nitride film, that copper is deposited by a CVD method using an organic copper compound as a reaction gas in the fourth step, that the plasma irradiation is carried out in a reaction gas comprising plasma-activated hydrogen gas, and that the plasma irradiation is carried out in a reaction gas comprising a plasma activated alkyl gas.

A copper wiring is formed by depositing the copper material to bury and fill the wiring grooves by virtue of the seed layer formed on the side wall of the wiring grooves or holes. This electroconductive carbon layer also serves as a barrier layer to prevent the copper wiring from being oxidized or corroded in the copper wiring structure thus constructed.

Accordingly, a copper wiring with a fine wiring groove structure can be constantly fabricated with a high reliability, thereby making it possible to readily reduce the wiring resistance.

DESCRIPTION OF THE PREFERRED EMBODIMENT

For better understanding of the present invention, a conventional copper wiring structure and a method of fabricating the same will be described hereinafter with reference to FIGS. 1 to 5.

Figure 1:
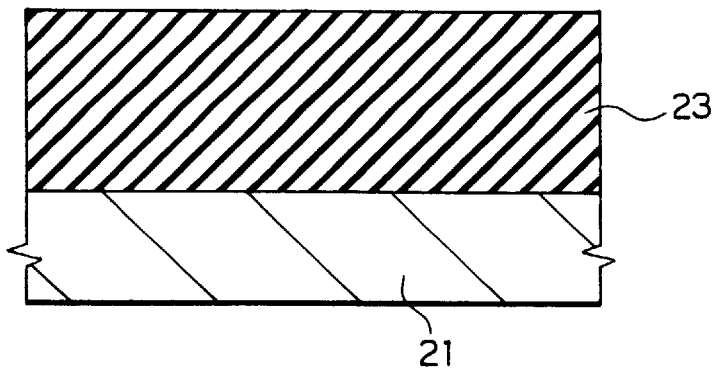
FIGS. 1 to 5 are the cross sectional views of the fabrication steps for use in illustrating the conventional art.
Figure 2:
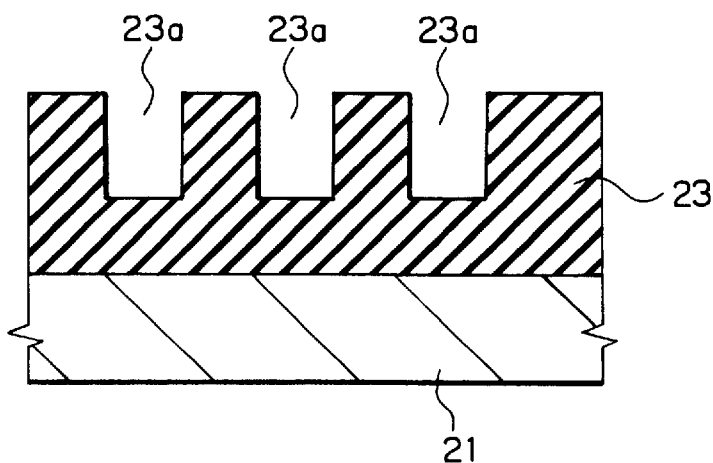
Figure 3:
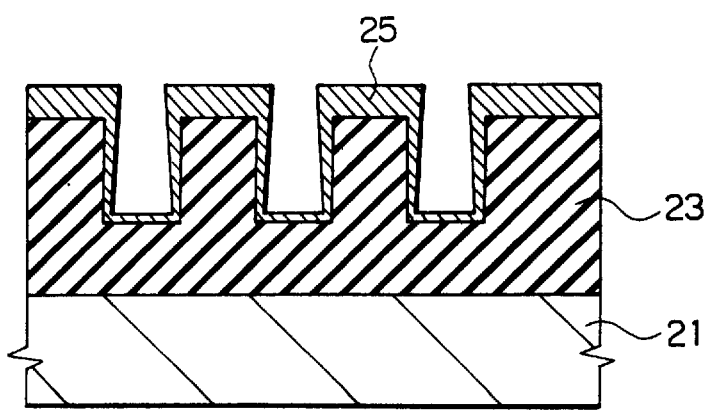

As shown in FIG. 1, an insulation film 23 is formed on a silicon substrate 21 by a chemical vapor phase deposition (CVD) process. This insulation film 23 comprises a silicon oxide film or the like. Then, a desired region of the insulation film 23 is etched by a RIE process forming a plurality of lines of wiring grooves 23a, 23a and so on as shown in FIG. 2. Such a wiring groove 23a has a width of 0.4 $\mu$m and a depth of 0.6 to 0.7 $\mu$m, respectively. As shown in FIG. 3, a titanium nitride film (TiN film) 25 is formed to a thickness of about 50 nm on the entire insulation film 23 including the wiring grooves 23a. Such the TiN film is deposited by a sputtering process.

Figure 4:
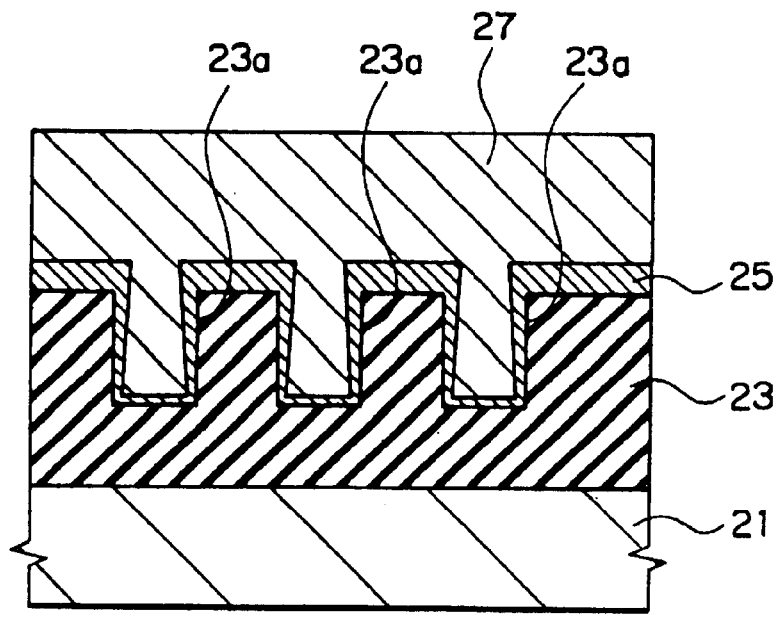

Then, as shown in FIG. 4, a copper film (Cu film) 27 is formed over the entire TiN film 25 by the CVD process. The prescribed thickness of the Cu film 27 is about 800 nm. The inside of the wiring groove 23a is completely buried with the Cu film 27. The TiN film 25 serves as a seed layer for growing the Cu film 27 in depositing the Cu film 27 by the CVD process.

Figure 5:
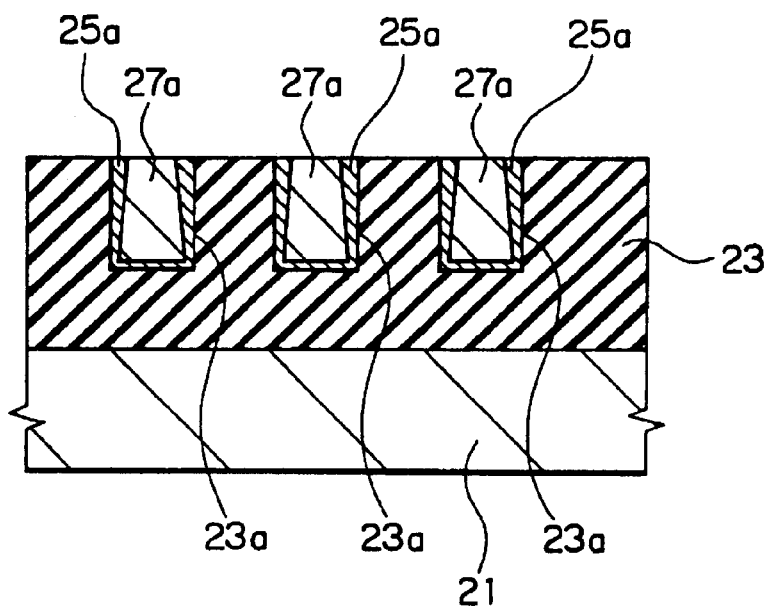

As shown in FIG. 5, removal is carried out on a top face of the insulation film 23 by a chemical-mechanical polishing (CMP) in the next step. Actually, the removal is carried out of the Cu film 27 projecting out of the wiring grooves 23a, and the portions of the Cu film 27 and TiN film 25 from above the insulation film 23 outside of the wiring grooves 23a to form the wiring grooves 23a on the surface of the insulation film 23 on the silicon substrate 21. A copper wiring 27a is formed only inside of the wiring grooves 23a via the TiN film 25a as a seed layer.

Now, the preferable embodiment according to the present invention will be described hereinafter referring to FIGS 6 through 10.

Figure 6:
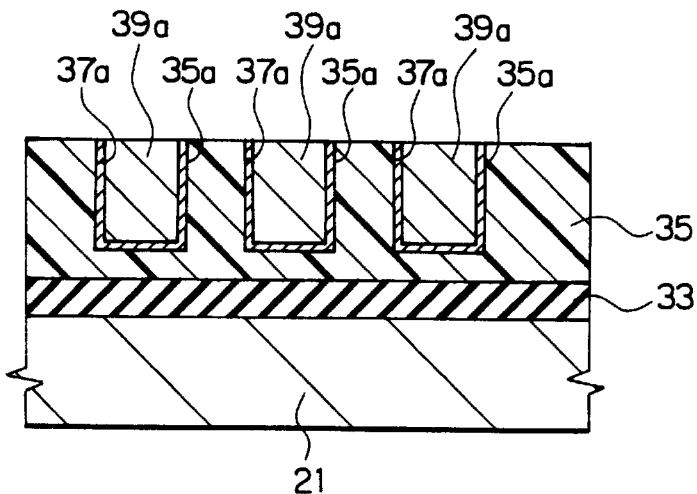
FIGS. 6 to 10 are the cross sectional views showing the fabrication steps of the copper wiring structures according to the first embodiment of the present invention.

Referring to FIG. 6, the copper wiring structure according to the first embodiment of the present invention is formed on an underlying insulation film 33 formed on the silicon substrate 21. An organic interlayer film 35 is provided on the underlying insulation film 33. The organic interlayer film as is provided with a plurality of wiring grooves 35a, 35a and so on. Each portion of the electroconductive carbon layers 37a is formed on the inner wall and bottom face of this wiring groove 35a. A copper wiring 39a is buried in the wiring groove 35a.

The steps of fabricating the copper wiring according to the first embodiment of the present invention will be described hereinafter.

Figure 7:
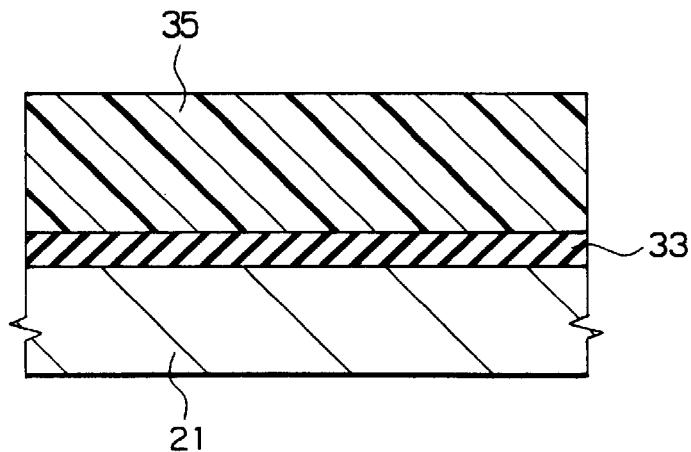

As shown in FIG. 7, the underlying insulation film 33 is flattened and is, thereafter, formed on the entire surface of the silicon substrate 21. The underlying insulation film 33 is a silicon oxide film with a thickness of about 200 nm deposited by the CVD process.

Then, an organic interlayer film 35 is formed on the underlying insulation film 33 to a thickness of about 800 nm. This organic interlayer film 35 comprises an organic interlayer film deposited by the plasma CVD process, which process uses reaction gasses composed of tetrafluorocarbon ($CF_4$) and methane ($CH_4$). The organic interlayer film 35 is thus an amorphous carbon film supplemented or added with fluorine having a relative dielectric constant of 3 or less. This amorphous carbon film that is supplemented with fluorine is referred to as an a-CF film hereinafter. In the a-CF, the fluorine content is adjusted to be 30 to 40 atomic percent.

Figure 8:
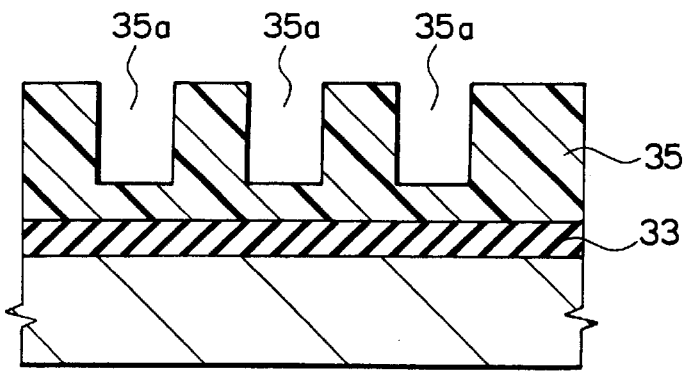

As shown in FIG. 8, a desired region of the organic interlayer film 35 is composed of the a-CF film and is finely processed by a photolithographic technique and dry etching technique to form the wiring groove 35a in the organic interlayer film 35. About 0.2 $\mu$m of width and space are possessed for the wiring groove 35a and between adjacent wiring grooves 35a, respectively, while about 0.5 $\mu$m of the depth is possessed for this wiring groove 35a.

Figure 9:
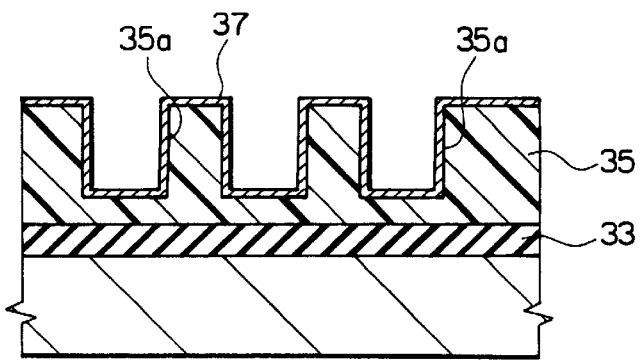

The wiring grooves are formed in the organic interlayer film 35. The organic interlayer film 35 is exposed to a hydrogen plasma or irradiated with a plasma, followed by a heat treatment at about 200° C. The electroconductive carbon layer 37 is thus formed on the inner wall of the wiring groove 35a and on the top of the organic interlayer film 35 as shown in FIG. 9. The electroconductive carbon layer 37 is adjusted to a thickness of about 10 nm.

Surface modification of the organic interlayer film 35 will be described hereinafter with reference to FIG. 11.

Figure 10:
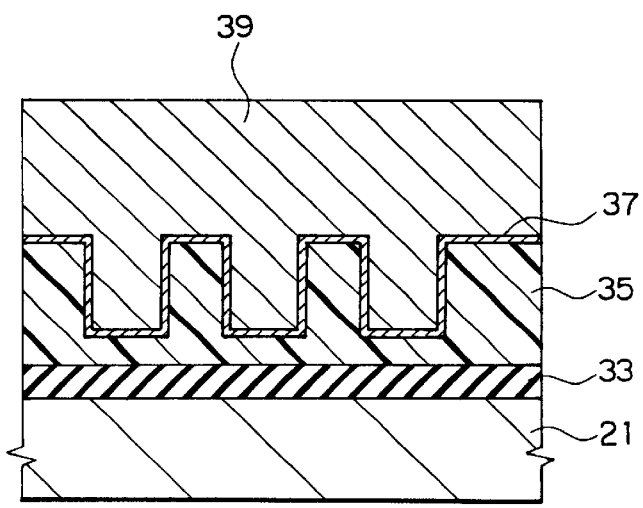

Then, as shown in FIG. 10, a Cu film 39 is deposited to a film thickness of about 400 nm by the CVD process so that the film covers the entire surface of the electroconductive carbon layer 37. For the CVD reaction gas of the Cu film 39, use is made of hexafluoroacetyl-cerobato copper (1) trimethylvinylsilane. The film forming temperature is adjusted to 180° C. while the reaction gas pressure is adjusted to 20 Torr. This Cu film 39 is formed at the deposition speed of 100 nm/min.

In the next step, removal is carried out of the excessive Cu film 39 at above the top face of the organic interlayer film 35 and the electroconductive carbon layer on the organic interlayer film 35 by the CVD method as in the conventional art. As shown in FIG. 6, the copper wiring 39a is formed in the wiring grooves 35a via the electroconductive carbon layer 37a. The wiring groove 35a is formed on the organic interlayer film 35 covering the underlying insulation film 33 on the silicon substrate 21 by the procedure described above, in which the copper wiring 39a of the wiring structure in grooves is formed. The electroconductive carbon layer 37a serves as a barrier layer, that is, the electroconductive carbon layer 37a completely prevents the copper wiring 39a from being oxidized by, for example, moisture existing in the organic interlayer film 35.

It was impossible in the conventional art to fabricate the copper wiring which has fine wiring in grooves as shown in this embodiment. On the contrary, copper wiring can be easily fabricated to have a dimension of the order of sub-microns according to the present invention.

The copper wiring had a wiring structure in grooves and was fabricated with the same design dimension as described in the prior art to make a comparison between the method in the conventional art and the method in the present invention, confirming that the copper wiring fabricated by the method according to the present invention has a lower resistance than that fabricated by the conventional art. The resistance is reduced by about 30% as small as that in the conventional art.

The crucial technical construction in the present invention is to form an electroconductive carbon layer having a uniform film thickness by a surface modification of the organic interlayer film. This modification procedure will be described hereinafter referring to FIG. 11.

Figure 11:
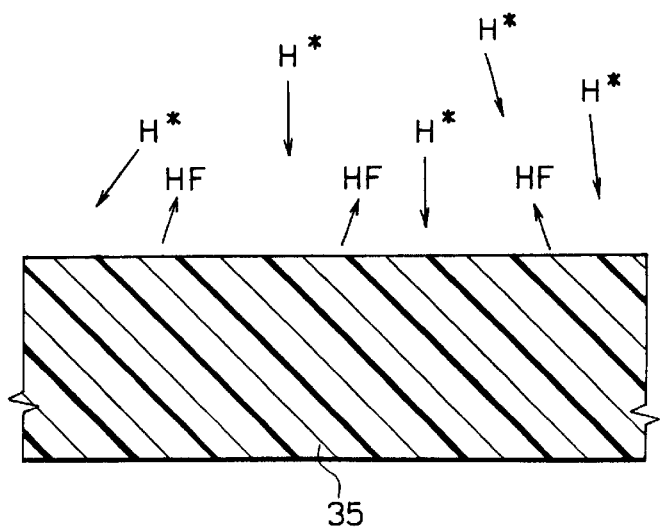
FIG. 11 is an illustrative drawing for use in explaining formation of the conductive carbon layer in the copper wiring structure according to the first embodiment of the present invention.

As shown in FIG. 11, a reaction takes place between hydrogen ions or hydrogen radicals in the hydrogen plasma and fluorine (F) in the a-CF film on the surface of the organic interlayer film 35 when the surface of the organic interlayer film 35 as an a-CF film is exposed to the hydrogen plasma, thereby forming hydrogen fluoride (HF) that is discharged as a reaction gas. Accordingly, merely carbon is formed on the surface of the organic interlayer film 35. When a heat treatment is further applied at about 200° C., sintering is carried out of the carbon layer on the surface of the organic interlayer film 35 to modify the surface into the electroconductive carbon layer 37a.

As described above, modification of the surface is provided to the organic interlayer film 35 by the hydrogen plasma treatment. The modification is uniformly performed irrespective of its surface configurations. Accordingly, uniform conversion is made of the inner wall of the wiring groove 35a or the top face of the organic interlayer film 35 into the electroconductive carbon layer 37.

The thickness of the electroconductive carbon layer 37 can be adjusted to as thin as about 10 nm in the present invention. Therefore, it is advantageous to cool the silicon substrate 21 to keep the organic interlayer film 35 at a low temperature in the surface modification of the organic interlayer film 35 by the hydrogen plasma treatment. For example, the silicon substrate 21 is cooled nearly to liquid nitrogen temperature. In the organic interlayer film 35, suppression may be made of thermal diffusion of hydrogen ions or hydrogen radicals to subject only the topmost surface of the organic interlayer film 35 to modification by cooling the organic interlayer film 35. The hydrogen plasma treatment is carried out by a hydrogen discharge using parallel flat electrodes or by a down-flow process.

An alkyl gas, such as methane gas or ethane gas, may be plasma-excited instead of the hydrogen plasma treatment to subject the organic interlayer film to the surface modification treatment in such plasma excitation gas. Deposition of carbon is proceeded simultaneously with the surface modification in this case, largely reducing the treatment time for modification.

The second embodiment of the present invention will be described hereinafter referring to FIG. 12 to FIG. 16. FIG. 12 to FIG. 16 show cross sections of the sequential production steps for selectively depositing the Cu films. The same parts as described in FIG. 1 to FIG. 11 are indicated by the same reference numerals in FIGS. 12 to 16.

Figure 12:
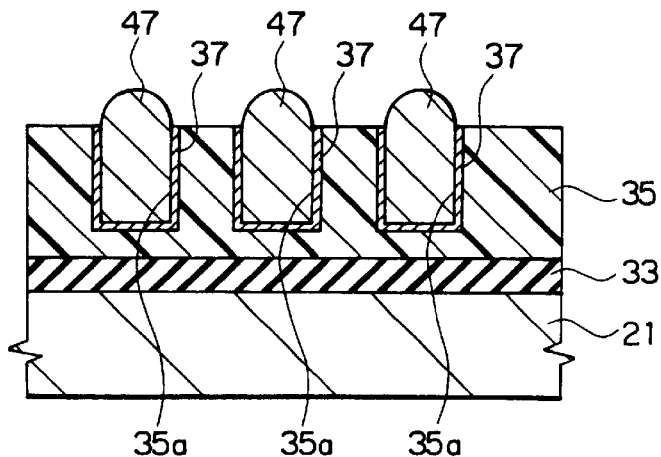
FIGS. 12 to 16 are the cross sectional views showing the fabrication steps of the copper wiring structure according to the second embodiment of the present invention.

Referring to FIG. 12, an underlying insulation film 33 is deposited on the silicon substrate 21, on which an organic interlayer film 35 is formed. A plurality of wiring grooves 35a are provided in the organic interlayer film 35. A conductive carbon layer is formed on the inner wall and bottom face of the wiring groove 35a. A copper wiring 47 is provided in the wiring groove 35a, the top portion of which is projected out of the organic interlayer film 35.

Figure 13:
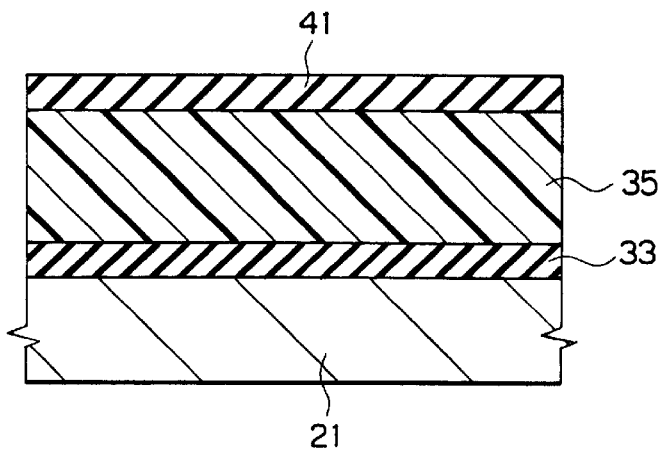

The method of fabricating the copper wiring structure according to the second embodiment will be described hereinafter. As shown in FIG. 13, a underlying insulation film 33 is formed on the entire surface of the silicon substrate 21 as in the first embodiment. The underlying insulation film 33 is composed of a silicon oxide film with a film thickness of about 100 nm.

An organic interlayer film 35 is formed to a film thickness of about 500 nm on the underlying insulation film 33. The organic interlayer film 35 is composed of the a-CF film as described in the first embodiment. Then, a protective insulation film 41 is laminated on the organic interlayer film 35. The protective insulation film 41 is composed of a silicon nitride film with a film thickness of about 100 nm deposited by the plasma CVD method.

Figure 14:
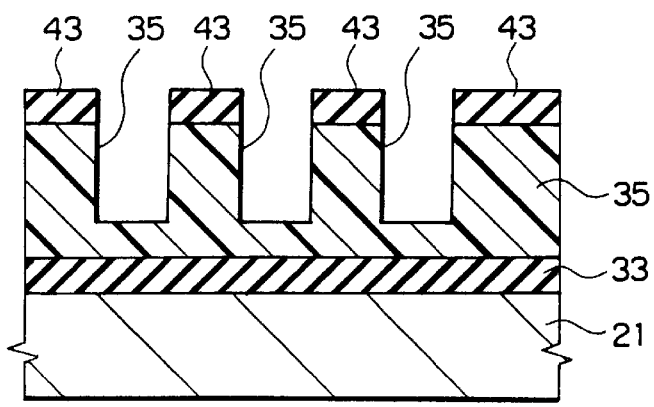

Then, as shown in FIG. 14, a fine processing is carried out at the desired regions of the protective insulation film 41 and organic interlayer film 35 to be laminated to by the photo-lithographic and dry-etching techniques, leaving a mask insulation film 43 and forming wiring grooves 35 having the same pattern. About 0.1 $\mu$m of width and space are possessed for the wiring groove 35 and between the adjacent wiring grooves, respectively, while a depth of about 0.3 $\mu$m is possessed for the wiring groove 35.

Figure 15:
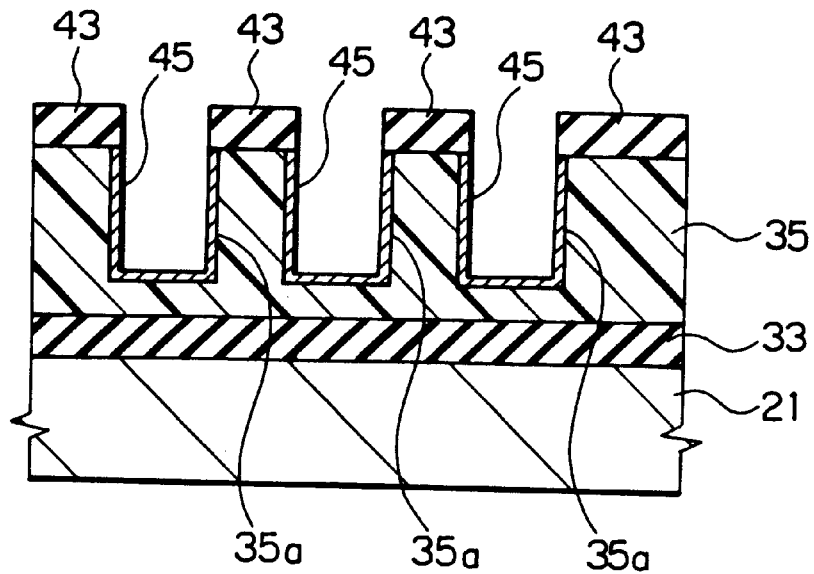

In the next step, the organic interlayer film 35 with the wiring grooves 35a fabricated therein is exposed to the hydrogen plasma as in the first embodiment, followed by subjecting to a heat treatment at about 200° C. The electroconductive carbon layer 45 is formed only on the inner wall of the wiring grooves 35*a* as shown in FIG. 15 by the procedure described above. The electroconductive carbon layer 45 is adjusted to a thickness of about 10 nm. No electroconductive carbon layer is formed on the top of the organic interlayer film 35 since this area is protected with the mask insulation film 43. The electroconductive carbon layer is not also formed on the surface of the mask insulation film 43 because it is composed of a silicon nitride film.

Figure 16:
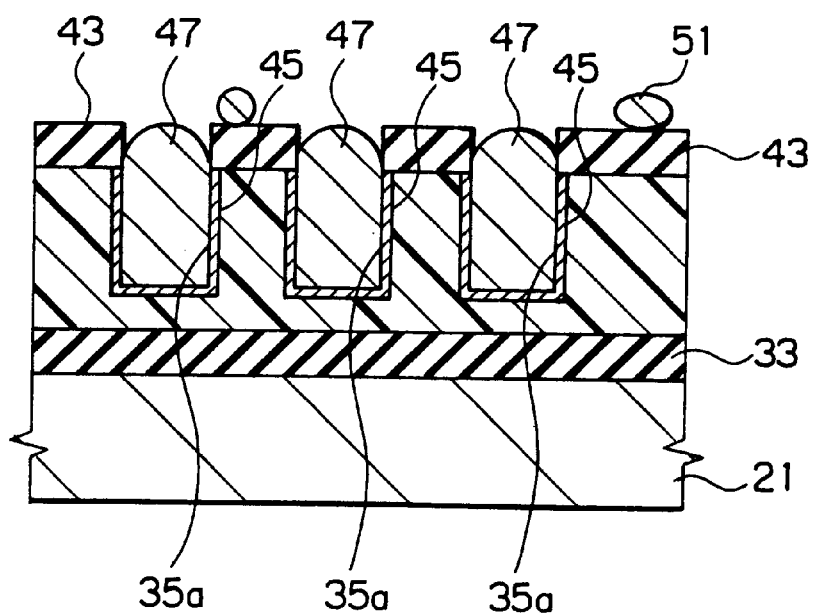

A selective Cu film 47 is formed so that it is buried into the wiring grooves 35 by the selective CVD method as shown in FIG. 16. The selective CVD is carried out by the same method as described in the first embodiment, wherein hexafluoroacetylacetonato copper (1) trimethylvinylsilane is used for the reaction gas in CVD. The film forming temperature is adjusted to 180° C. and the reaction gas pressure is adjusted to 50 mTorr. This selective Cu film is deposited at a deposition speed of 40 nm/min.

Cu atoms are selectively deposited on the site having an electro-conductivity, or on the electroconductive carbon layer 45, by utilizing it as growth seeds when the Cu film is deposited under the conditions as described above. The Cu atoms are made to deposit on the inner wall of the wiring grooves 35*a* covered with the electroconductive carbon layer 45 and form the selective Cu film 47 in the wiring grooves 35*a*. However, a small amount of non-selective Cu films 51 may be formed on the mask insulating film 43 when the selectivity is deteriorated.

The mask insulation film 43 is removed in a chemical solution in the next step. A hot phosphoric acid solution is used for removing the mask insulating film 43 since it is a silicon nitride layer. The non-selective Cu films 51 can be also removed by the same principle as that of a lift-off process in the elimination step of the mask insulating film 43. The selective Cu film 47 is thus fabricated so that it is buried into the wiring grooves 35*a* provides in the organic interlayer film 35 via the electroconductive carbon layer 45 as shown in FIG. 12.

As for the projected portions of the selective Cu film 47, removal can be carried out by the CMP process as described in the first embodiment. Consequently, the copper wiring having the same wiring structure in grooves as described in FIG. 6 is fabricated.

While the mask insulation film 43 is formed of the silicon nitride film, it should be noted that the mask insulation film is not limited thereto but inorganic insulation films such as a silicon oxide film may be used as well.

The CMP process time can be largely reduced in the second embodiment since only the projected portions of the selective Cu film are eliminated. For example, the CMP process time of 5 minutes in the first embodiment is reduced to 1 minute in the second embodiment. Moreover, large improvement is attributed the production yield of the semiconductor device, which has the copper wiring as described above.

However, such CMP process as described above will be unnecessary when the selectivity is made perfect in the selective CVD of the Cu film and control of its thickness is improved, more reducing the production steps.

In addition, it is possible not to remove the mask insulation film 43 but to leave it before the CMP process.

While the art of forming the Cu film by the CVD method has been described in the embodiments hitherto described, it should be noted that a plating method could be also applied in depositing the Cu film. It should be also noted that, though use of the a-CF film as an organic interlayer film has been mentioned, the present invention could be also applied for organic insulation materials provided that their surface could be modified into a carbon layer by the plasma treatment as described in the embodiments. The present invention may be also applied for the case where a copper material is buried into the holes formed in the organic interlayer film instead of forming wiring grooves.

The case when the wiring grooves or holes provided in the organic interlayer film are modified into electroconductive carbon layers has been described in detail in the explanation according to the present invention. A SiC layer containing silicon or a TiCN layer containing Titanium (Ti) and nitrogen (N) other than the electroconductive layer may be formed for the modification of these wiring grooves or holes. A mixed gas of silane ($SiH_4$) and $CH_4$ is irradiated for forming a SiC layer containing silicon while a gas of tetrakisdiethylaminotitanium (TTEAT) or tetrakisdimethylaminotitanium (TTMAT) is irradiated for forming the TiCN layer containing Ti and N. These irradiation gases may be plasma-activated.

Though merely the first copper wiring layer has been described in the foregoing embodiments, a multilayer copper interconnection having a wiring structure in grooves may be fabricated provided that the second copper wiring layer could be formed by the same method as described in the preferable embodiments.

Figure 17:
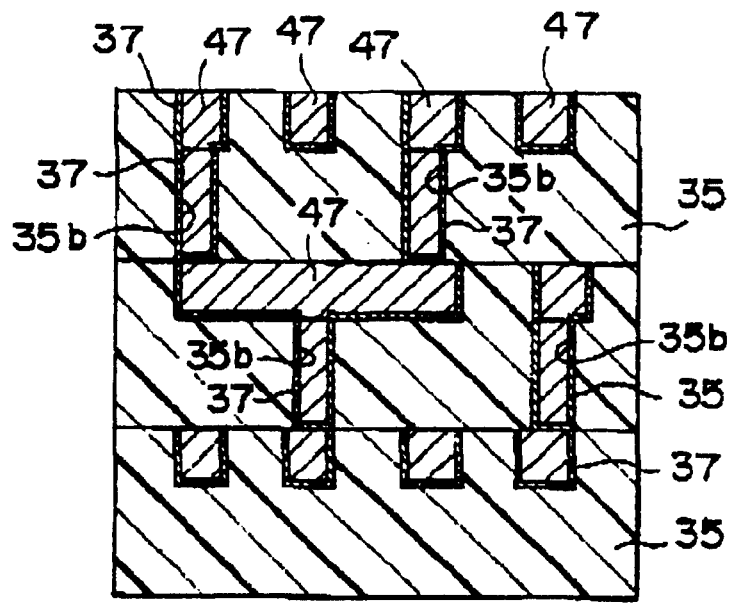
FIG. 17 is a cross sectional view partly showing a multilayer structure according to the third embodiment of the present invention.

Referring to FIG. 17, a multilayer structure of the third embodiment is formed by stacking a plurality of the copper wiring layers described above. The copper wiring layers are connected to each other through via hold 35*b*. The via hole 35*b* is formed in the organic interlayer 37 and is filled with copper.

In a similar manner as described above, the via hole 35*b* if formed in place of the wiring groove 35*a*, and is changed to be conductive at a surface of the organic interlayer films 35, and is thereafter subjected to deposition of copper (Cu). The via hole 35*b* and the wiring groove 35*b* may be filled with copper individually. Alternatively, the organic interlayer 35 may be pre-shaped to form the via hole 35*b* and the wiring groove 35*a*. Thereafter, both of the via hole 35*b* and the wiring groove 35*a* may be simultaneously fille with copper as shown in FIG. 17.

Figure 18:
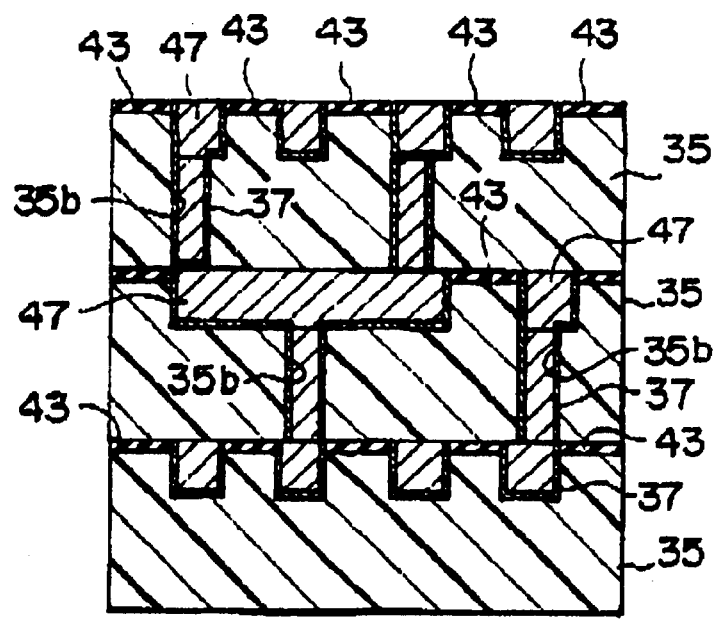
FIG. 18 is a cross sectional view partly showing a multilayer structure according to the fourth embodiment of the invention .

Referring to FIG. 18, the multilayer structure of the fourth embodiment is similar to that described in connection with FIG. 17 except that the protective insulation is left.

As is apparent from the foregoing descriptions, the wiring grooves are fabricated at the desired region of the organic interlayer film in the copper wiring having a wiring structure in grooves according to the present invention, the inner wall face of this wiring grooves being modified into electroconductive carbon layers during the plasma treatment. This electroconductive carbon layer is used for a growth seed layer while the copper wiring in the wiring structure in grooves is fabricated by depositing the copper film so as to bury the wiring grooves. This electroconductive carbon layer also serves as a barrier layer, preventing the copper wiring from oxidation or corrosion.

The electroconductive carbon layer according to the present invention is formed into a thin and uniform layer, thereby making it possible to easily fabricate the copper wring in the wiring structure in grooves even when the wiring dimension is made very fine. Since the occupied proportion is represented by the electroconductive carbon layer in the cross section of the copper wiring to be 10% or less, the practical wiring resistance can be largely reduced as compared with the resistance in the conventional art.

The induced capacity by the wiring is diminished in the present invention since the copper wiring is fabricated in the organic interlayer film having a small relative dielectric constant. Because reduction is performed in the resistance and capacitance in the copper material, improvement can be attributed in the transmission speed through the wiring layer, even in a finely processed semiconductor device, enhancing high speed responses of the semiconductor device.

According to the present invention hitherto described, the copper wiring in the finely processed wiring structure in grooves may be steadily fabricated with a high reliability, accelerating the fabrication of the highly integrated semiconductor device having a high response speed.

What is claimed is:

1. A method of fabricating a copper wiring structure of the semiconductor device comprising:

a first step of forming a film for fabricating wiring including an organic interlayer film containing carbon as a main component on the semiconductor substrate;

a second step of forming hollow portions from the top face side of the film for fabricating wiring;

a third step of forming an electroconductive carbon layer by a modification of the surface including the inner side of the concave portions of the organic interlayer film; and a fourth step of selectively depositing copper on the electroconductive carbon.

2. A method according to claim 1, wherein said organic interlayer film is an amorphous carbon film supplemented with fluorine deposited by a plasma CVD process using a reaction gas composed of tetrafluorocarbon and methane.

3. A method according to claim 1, wherein said first step contains a substep of forming an inorganic insulation film on said organic interlayer film after forming said organic interlayer film.

4. A method according to claim 3, wherein said inorganic insulation film consists essentially of a silicon nitride film.

5. A method according to claim 3, wherein said fourth step includes a step for depositing said copper by a CVD process using an organic copper compound as a reaction gas.

6. A method according to claim 1, wherein said third step includes a step for forming said electroconductive carbon layer by a modification of the exposed face of said organic interlayer film using a plasma irradiation.

7. A method according to claim 6, wherein said plasma irradiation is carried out in a reaction gas consisting essentially of a plasma activated hydrogen gas.

8. A method according to claim 6, wherein said plasma irradiation is carried out in a reaction gas consisting essentially of a plasma activated alkyl gas.

* * * * *